United States Patent
Yokokura et al.

(10) Patent No.: US 7,397,882 B2
(45) Date of Patent: Jul. 8, 2008

(54) DIGITAL PHASE LOCKED CIRCUIT CAPABLE OF DEALING WITH INPUT CLOCK SIGNAL PROVIDED IN BURST FASHION

(75) Inventors: Ichiro Yokokura, Yokohama (JP); Yuji Obana, Yokohama (JP); Hideaki Mochizuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 643 days.

(21) Appl. No.: 10/671,593

(22) Filed: Sep. 29, 2003

(65) Prior Publication Data

US 2004/0062337 A1 Apr. 1, 2004

(30) Foreign Application Priority Data

Sep. 30, 2002 (JP) .............................. 2002-284761

(51) Int. Cl.
H03D 3/24 (2006.01)
(52) U.S. Cl. ..................... 375/376; 375/371; 375/372; 375/373; 375/374; 375/375; 327/147; 327/148; 327/149; 327/150; 327/151; 327/156; 327/157; 327/158; 327/159
(58) Field of Classification Search ......... 375/371–376; 329/307–309; 332/127–128; 702/72; 327/147–159
See application file for complete search history.

(56) References Cited

U.S. PATENT DOCUMENTS

| | | | | |
|---|---|---|---|---|
| 4,030,045 A | * | 6/1977 | Clark | 331/1 A |
| 5,781,054 A | * | 7/1998 | Lee | 327/231 |
| 6,154,071 A | * | 11/2000 | Nogawa | 327/156 |
| 6,233,297 B1 | * | 5/2001 | Itoh | 375/376 |
| 6,920,622 B1 | * | 7/2005 | Garlepp et al. | 716/6 |
| 2003/0076911 A1 | * | 4/2003 | Kobayashi et al. | 375/372 |

FOREIGN PATENT DOCUMENTS

| | | |
|---|---|---|
| JP | 6-53821 | 2/1994 |
| JP | 7-86926 | 3/1995 |

* cited by examiner

Primary Examiner—Curtis Odom
(74) Attorney, Agent, or Firm—Staas & Halsey LLP

(57) ABSTRACT

A digital phase locked circuit provides an output clock signal whose phase is synchronous with the phase of an input clock signal under a desired level of a phase absorption characteristic even if the input clock signal is supplied in a burst fashion. A phase comparing part compares the phase of the output clock signal with the phase of the input clock signal. A phase comparison result detecting part outputs an INC/DEC request signal for controlling a division operation based on a phase comparison signal. An execution rate computing part computes a phase difference between the input clock signal and the output clock signal based on the INC/DEC request signal and outputs an execution rate corresponding to the phase difference. A clock generating part controls a division operation for the master clock signal in accordance with the INC/DEC request signal and changes phase absorption speed of the output clock signal in accordance with the execution rate.

5 Claims, 11 Drawing Sheets

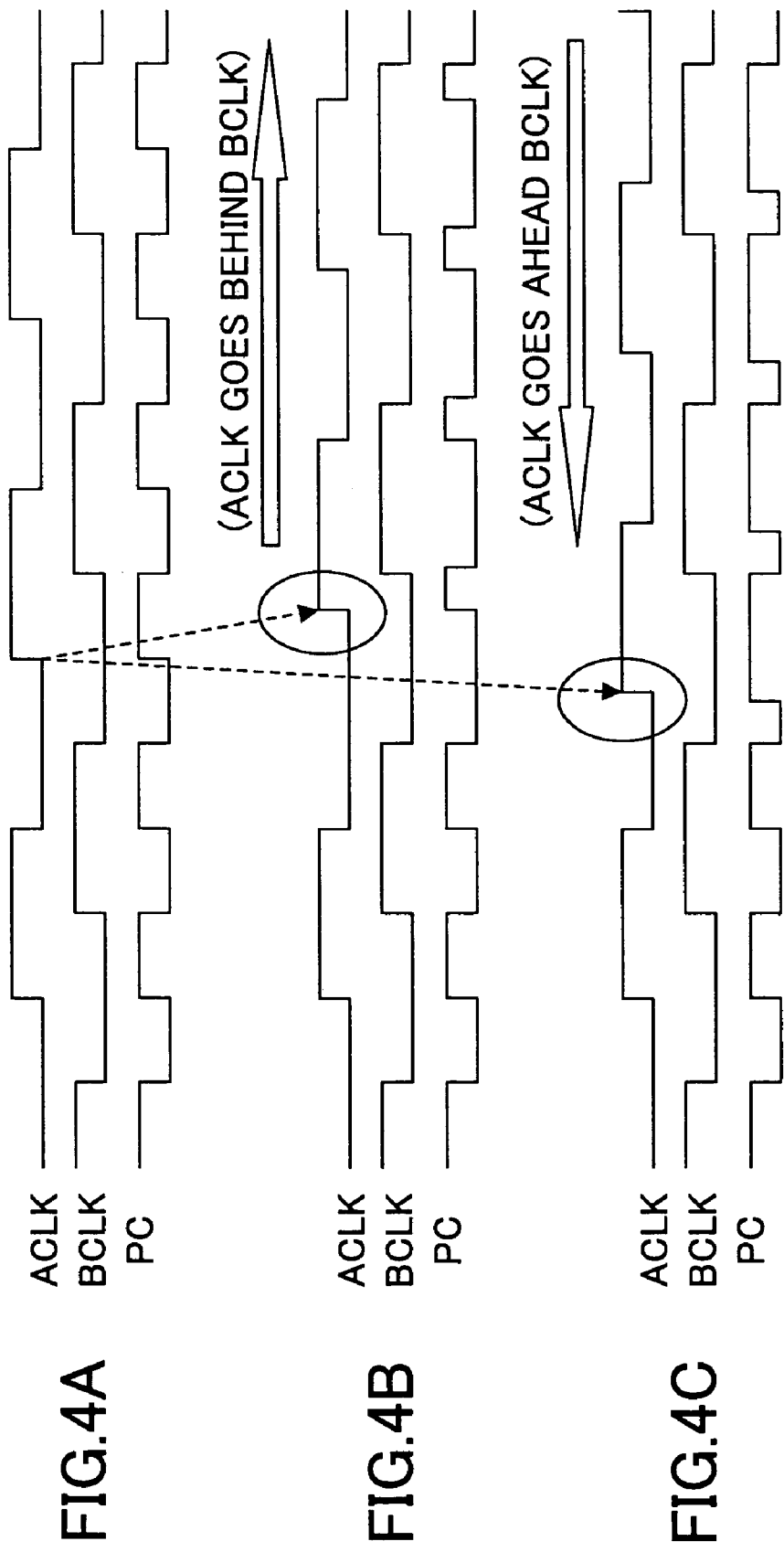

FIG.7

| PHASE DIFFERENCE | EXECUTION RATE | PHASE DIFFERENCE | EXECUTION RATE | PHASE DIFFERENCE | EXECUTION RATE | PHASE DIFFERENCE | EXECUTION RATE | PHASE DIFFERENCE | EXECUTION RATE |
|---|---|---|---|---|---|---|---|---|---|
| 50bit | 1/1 | 40bit | 1/1 | 30bit | 3/4 | 20bit | 1/2 | 10bit | 1/2 |
| 49bit | 1/1 | 39bit | 1/1 | 29bit | 3/4 | 19bit | 1/2 | 9bit | 1/2 |
| 48bit | 1/1 | 38bit | 1/1 | 28bit | 3/4 | 18bit | 1/2 | 8bit | 1/2 |
| 47bit | 1/1 | 37bit | 1/1 | 27bit | 3/4 | 17bit | 1/2 | 7bit | 1/2 |
| 46bit | 1/1 | 36bit | 1/1 | 26bit | 1/2 | 16bit | 1/2 | 6bit | 1/4 |
| 45bit | 1/1 | 35bit | 3/4 | 25bit | 1/2 | 15bit | 1/2 | 5bit | 1/2 |
| 44bit | 1/1 | 34bit | 3/4 | 24bit | 1/2 | 14bit | 1/2 | 4bit | 1/2 |
| 43bit | 1/1 | 33bit | 3/4 | 23bit | 1/2 | 13bit | 3/4 | 3bit | 1/2 |
| 42bit | 1/1 | 32bit | 3/4 | 22bit | 1/2 | 12bit | 3/4 | 2bit | 1/2 |
| 41bit | 1/1 | 31bit | 3/4 | 21bit | 1/2 | 11bit | 3/4 | 1bit | 1/2 |

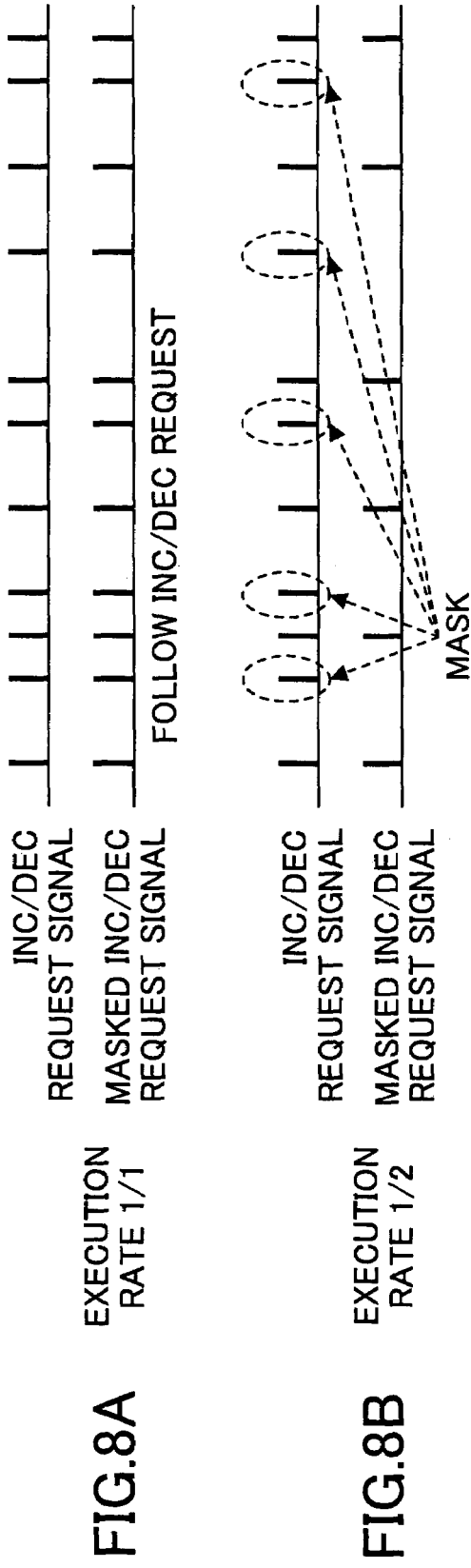

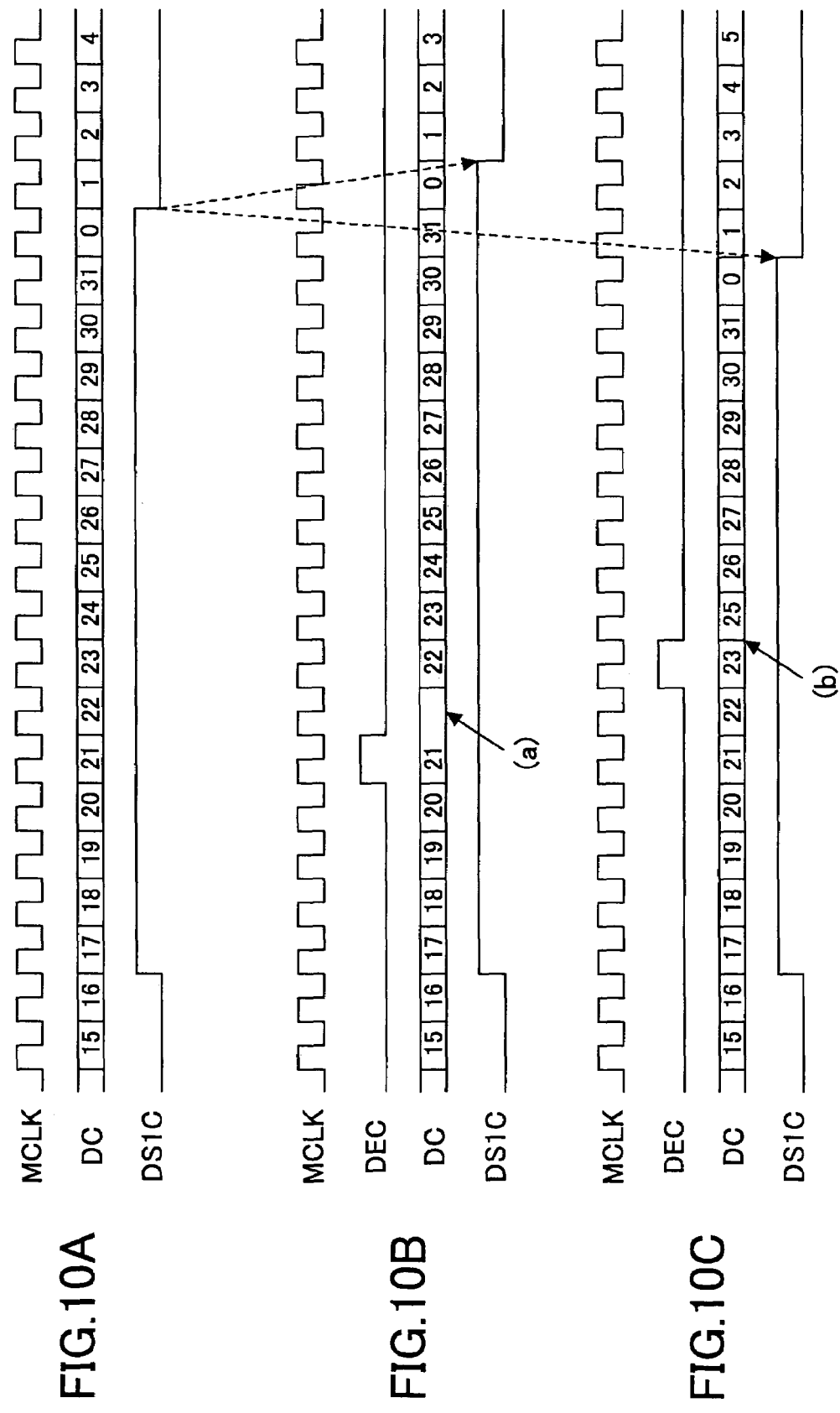

DIGITAL PHASE LOCKED CIRCUIT CAPABLE OF DEALING WITH INPUT CLOCK SIGNAL PROVIDED IN BURST FASHION

CROSS-REFERENCE TO RELATED APPLICATIONS

The present application is based on Japanese priority application No. 2002-284761 filed Sep. 30, 2002, the entire contents of which are hereby incorporated by reference.

BACKGROUND OF THE INVENTION

1. Field of the Invention

The present invention generally relates to a digital phase locked circuit that can not only output a phase locked signal for an input clock signal even if the input clock signal is supplied in a burst fashion but also achieve a satisfactory phase absorption characteristic.

2. Description of the Related Art

In SDH (Synchronous Digital Hierarchy), STM (Synchronous Transport Module)-1 (155 Mbps) is provided as a fundamental frame. In addition, for instance, STM-0, STM-4 and STM-16 are provided as frames for the bit rates 51 Mbps, 622 Mbps and 2.4 Gbps, respectively.

In the SDH and the similar method, SONET (Synchronous Optical Network), a frame comprises an overhead and a payload. For instance, a container C-N (N: 2, 3, 4, 11 and 12) becomes a virtual container VC-N by attaching a path overhead thereto, and then the virtual container VC-N is mapped to a payload for the data transmission. Here, the containers C-11, C-12 and C-2 have bit rates 1.544 Mbps, 2.048 Mbps and 6.312 Mbps, respectively.

In order to demap the transmitted container C-N from the payload, it is necessary to identify the head position of the mapped container C-N based on a pointer thereof and extract the byte-interleaved container C-N. Then, the extracted container C-N, for instance, is written in a memory and is subsequently read from the memory based on a read clock signal whose phase is synchronous with that of the write clock signal that has been generated when the container C-N is written in the memory.

FIG. 1 is a diagram for explaining a conventional demapping process for C-N data. As is shown in FIG. 1, a digital phase locked circuit, which is referred to as a DPLL circuit hereinafter, conventionally comprises a C-N demapping part 51, a memory 52, a phase comparing part 53 and a DPLL (Digital Phase Locked Loop) part 54. The C-N demapping part 51 receives an SDH frame synchronous with a system clock signal. Then, the C-N demapping part 51 demaps target C-N data from the payload of the input SDH frame with reference to the pointer thereof in accordance with the system clock signal. Then, the demapped C-N data are delivered to the memory 52 and are written therein in accordance with a write clock signal WCLK synchronous with the demapped C-N data.

The DPLL part 54 receives a master clock signal and then supplies a read clock signal RCLK. The phase comparing part 53 compares the read clock signal RCLK with the write clock signal WCLK and delivers a phase comparison signal to the DPLL part 54 in order to synchronize the read clock signal RCLK with the write clock signal WCLK. The C-N data are consecutively read from the memory 52 in accordance with the read clock signal RCLK and then are delivered to the next circuit together with the read clock signal as a clock signal of the next circuit.

Based on the phase comparison signal from the phase comparing part 53, which indicates whether the phase of the read clock signal RCLK goes ahead or behind that of the write clock signal WCLK, the DPLL part 54 deletes/inserts one pulse from/into the master pulse or changes a dividing ratio for the master clock signal in order to lock the phase of the read clock signal RCLK with that of the write clock signal WCLK.

In this case, since the C-N data from the C-N demapping part 51 are extracted from the payload of the SDH frame by unit of one byte, the write clock signal WCLK is also synchronized with the C-N data. The phase comparing part 53 compares the phase of the continuous read clock signal RCLK with that of the write clock signal WCLK generated in a burst fashion. Here, the comparing part 53 can be implemented, for instance, with an exclusive OR circuit. When the phase comparing part 53 supplies a phase comparison signal to the DPLL part 54, the DPLL part 54 synchronizes the phase of the read clock signal RCLK with that of the write clock signal WCLK by changing the current dividing ratio for the master clock signal into a more appropriate value or by deleting/inserting one pulse from/into the master clock signal.

In the case where the phase comparison signal is set as an output signal of the exclusive OR of the write clock signal WCLK and the read clock signal RCLK as mentioned above, an up-down counter is provided in the DPLL part 54. The up-down counter counts up/down a counter value thereof while the phase comparison signal is HIGH/LOW, respectively. When the counter value reaches a predetermined value, one pulse is deleted/inserted from/into the master clock signal so as to lock the phase of the read clock signal RCLK with the write clock signal WCLK. Namely, such an up-down counter serves as a low path filter of the phase locked loop.

Japanese Laid-Open Patent Application No. 06-053821 discloses a DPLL circuit for producing an output clock signal whose phase is synchronous with that of an input clock signal. In this DPLL circuit, an up-down counter is used to compare the phase of the output clock signal with the phase of the input clock signal like the above-mentioned conventional DPLL circuit. Based on a comparison result, a pulse is deleted/inserted so that the output clock signal can be locked with the input clock signal. Here, the DPLL circuit measures a phase difference between the output clock signal and the input clock signal and then classifies the phase difference into two or three classes, that is, a large difference class and a small difference class or a large difference class, a medium difference class and a small difference class. If the measured phase difference is classified into the small difference class, one pulse of the system clock signal is deleted/inserted from/into the output clock signal for the phase control of the output clock signal. If the measured phase difference is classified into the large difference class, a pulse of a clock signal generated by dividing the system clock signal is deleted/inserted. Namely, it is possible to flexibly control the phase of the output clock signal by deleting/inserting a plurality of pulses of the system clock signal. As a result, it is possible to not only achieve speedy phase synchronization but also suppress jitter after the phase synchronization.

Japanese Laid-Open Patent Application No. 07-086926 discloses another DPLL circuit related to the present invention. In a PON (Passive Optical Network), even if sender timings for sending signals from a plurality of child stations to a parent station are set in advance, intervals between receiver timings when the parent station receives the signals from the child stations are not deterministic. This situation is substantially equivalent to a case where the parent receives signals from child stations in a burst fashion. In this case, the parent station uses the DPLL circuit to generate a higher-speed clock signal for identifying the received signals from the child stations. A plurality of shift registers delay the received signals in accordance with the higher-speed clock signal so that the received signals can have different delay times from each other. Then, individual phases of the delayed received signals are compared with that of the clock signal of the parent station. The DPLL circuit identifies the data from the child station having the received signal whose phase is equal to the phase of the parent station.

In the DPLL circuit according to Japanese Laid-Open Patent Application No. 06-053821, the DPLL circuit produces an output clock signal synchronous with an input clock signal. The DPLL circuit uses an up-down counter thereof to count the counter value based on a phase comparison result indicating whether the phase of the input clock signal goes ahead or behind the phase of the output clock signal. If the counter value reaches a predetermined value, one pulse of a master clock signal is deleted/inserted from/to the output clock signal. The DPLL circuit determines a phase difference between the input clock signal and the output clock signal and controls the quantity of insertions and deletions of the master clock corresponding to the phase difference. As a result, it is possible to not only achieve the phase synchronization at high-speed but also suppress jitter.

However, when the DPLL circuit is used to process C-N data demapped from a payload of an SDH frame, there arise some problems. In this case, the C-N data tend to be supplied in a burst fashion. Also, regarding position of the C-N data in SDH frames, the C-N data may be located at the same position for all the SDH frames or may be located at different positions for the individual SDH frames. Therefore, there is a probability that the demapped C-N data are not input in a constant time interval. In order to address such a situation, the DPLL circuit for processing C-N data is required to output a clock signal synchronous with the phase of the C-N data.

In the DPLL circuit according to Japanese Laid-Open Patent Application No. 07-086926, when the demapped C-N data are supplied in a burst fashion, the DPLL circuit may be designed to shift the demapped C-N data by using a plurality of shift registers so as to obtain a clock signal synchronous with the output data from the shift registers. However, since the plurality of the shift registers are provided in the DPLL circuit, the DPLL circuit becomes large in size. In addition, the DPLL circuit has difficulty in following phase variations of the input data.

Furthermore, a DPLL circuit is required to satisfy a predetermined MTIE (Maximum Time Interval Error) standard. As mentioned in Japanese Laid-Open Patent Application No. 06-053821, the DPLL cannot satisfy the predetermined MTIE standard by simply inserting/deleting a low-frequency pulse such as the master clock signal or a high-frequency pulse such as the output divided signal into/from the output clock signal in accordance with the phase difference. In other words, the DPLL circuit cannot achieve the satisfactory phase synchronization characteristic.

SUMMARY OF THE INVENTION

It is a general object of the present invention to provide a digital phase locked circuit in which the above-mentioned problems are eliminated.

A more specific object of the present invention is to provide a digital phase locked circuit that can lock a phase of a clock signal supplied in a burst fashion so that a desired characteristic can be satisfied.

In order to achieve the above-mentioned objects, there is provided according to one aspect of the present invention a digital phase locked circuit for synchronizing a phase of an output clock signal generated by dividing a master clock signal with a phase of an input clock signal, comprising: a phase comparing part comparing the phase of the output clock signal with the phase of the input clock signal; a phase comparison result detecting part outputting an INC/DEC request signal for controlling a division operation based on a phase comparison signal from the phase comparing part; an execution rate computing part computing a phase difference between the input clock signal and the output clock signal based on the INC/DEC request signal from the phase comparison result detecting part and outputting an execution rate corresponding to the phase difference; and a clock generating part controlling a division operation for the master clock signal in accordance with the INC/DEC request signal from the phase comparison result detecting part and changing phase absorption speed of the output clock signal by masking the INC/DEC request signal in accordance with the execution rate from the execution rate computing part.

In the above-mentioned digital phase locked circuit, the phase comparison result detecting part may have an up-down counter being counted up/down when a phase comparison signal being an exclusive OR signal of the input clock signal and the output clock signal from the phase comparing part is HIGH/LOW and a detecting part outputting a DEC request signal when a minimum counter value is detected and an INC request signal when a maximum counter value is detected.

In the above-mentioned digital phase locked circuit, the execution rate computing part may have a phase difference computing counter counting up/down a phase difference counter value thereof based on the INC/DEC request signal from the phase comparison result detecting part and setting the phase difference counter value as a computed phase difference and a phase absorption execution rate determining part outputting an execution rate corresponding to the computed phase difference with reference to a correspondence table in which correspondence between phase differences and execution rates is described.

In the above-mentioned digital phase locked circuit, the execution rate computing part may set the computed phase difference by summing up a plurality of counter values for each predetermined time interval, the counter values computed by sampling the phase difference counter in a shorter time interval.

Additionally, there is provided according to another aspect of the present invention a digital phase locked circuit for synchronizing a phase of an output clock signal generated by dividing a master clock signal with a phase of an input clock signal, comprising: a phase comparing part comparing the phase of the output clock signal with the phase of the input clock signal; a phase comparison result detecting part referring to a comparison result from the phase comparing part and outputting a signal for increasing/decreasing a division number for dividing the master clock signal when the phase of the output clock signal goes ahead/behind the phase of the input clock signal; and a control part changing phase absorption speed by controlling an adoption rate of the signal for increasing/decreasing the division number for dividing the master clock signal in accordance with a phase difference between the input clock signal and the master clock signal.

According to the above-mentioned invention, if the phase difference is large, the digital phase locked circuit increases the execution rate and exhibits high-speed phase absorption characteristics. In contrast, if the phase difference is small, the digital phase locked circuit decreases the execution rate and suppresses jitter. Furthermore, while the phase difference is shifting from a large difference to a small difference, the digital phase locked circuit can set the execution rate so that a desired phase absorption characteristics can be satisfied. As a result, it is possible to obtain an output clock signal phase-synchronous with an input clock signal even if the input clock signal is provided in a burst fashion.

Other objects, features and advantages of the present invention will become more apparent from the following detailed description when read in conjunction with the accompanying drawings.

BRIEF DESCRIPTION OF THE DRAWINGS

FIGS. 4A through 4C are signal timing charts related to a phase comparison signal PC in a case where a phase comparing part is formed as an exclusive OR circuit;

FIG. 7 is a correspondence table between phase differences and execution rates;

FIGS. 8A through 8D are diagrams for explaining mask processes for an input INC/DEC request signal in accordance with some execution rates;

FIGS. 10A through 10C are signal timing charts related to the clock generating part according to the embodiment.

DETAILED DESCRIPTION OF THE PREFERRED EMBODIMENTS

In the following, an embodiment of the present invention will be described with reference to the accompanying drawings.

Figure 2:
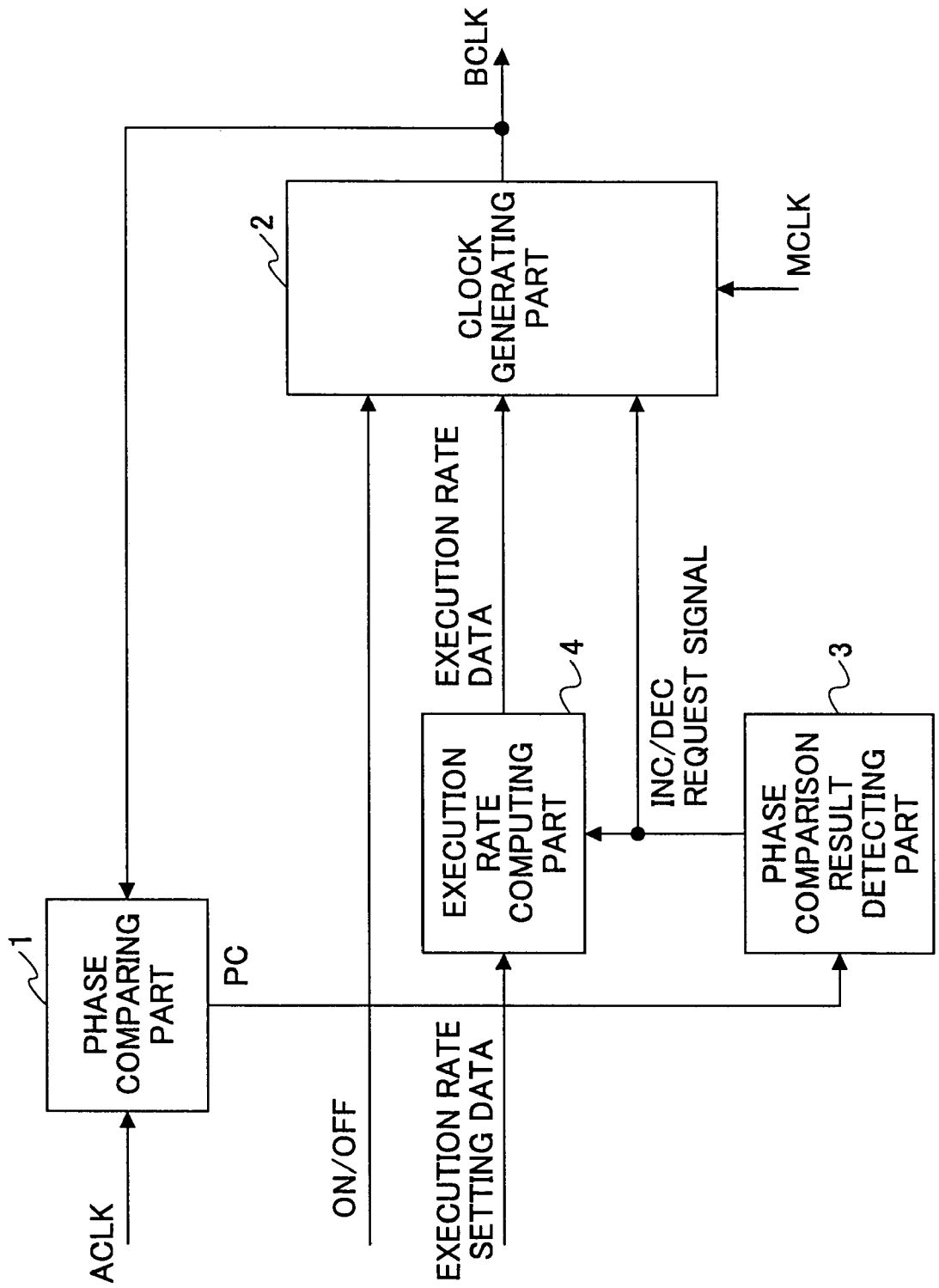
FIG. 2 is a block diagram illustrating the structure of a DPLL circuit according to an embodiment of the present invention.

FIG. 2 shows the structure of a DPLL circuit according to the embodiment of the present invention. As is shown in FIG. 2, the DPLL circuit comprises a phase comparing part 1, a clock generating part 2, a phase comparison result detecting part 3, and an execution rate computing part 4. Also, the DPLL circuit processes a master clock signal MCLK, an input clock signal ACLK, an output clock signal BCLK, a phase comparison signal PC, and a signal ON/OFF for a phase absorption operation.

The phase comparing part 1 compares the phase of the input clock signal ACLK with the phase of the output clock signal BCLK and then supplies the comparison result signal PC to the phase comparison result detecting part 3. For instance, if it is supposed that the phase comparison result signal PC is generated as an exclusive OR signal of the input clock signal ACLK and the output clock signal BCLK, the phase comparison result detecting part 3 counts up the counter value of an up-down counter therein when the phase comparison result signal PC is HIGH and counts down the counter value when the phase comparison result signal PC is LOW.

Consequently, if the phases of the input clock signal ACLK and the output clock signal BCLK are synchronized or an input of the input clock signal ACLK supplied in a burst fashion is suspended, the number of count-ups is approximately equal to the number of count-downs.

If the phase of the output clock signal BCLK is delayed to the phase of the input clock signal ACLK, the number of count-ups increases. After that, when the phase comparison result detecting part 3 detects that the number of count-ups has reached a predetermined value, the phase comparison result detecting part 3 outputs an INC request signal.

In contrast, if the phase of the output clock signal BCLK goes ahead the phase of the input clock signal ACLK, the number of count-downs increases. After that, if the phase comparison result detecting part 3 detects that the number of count-downs has reached a predetermined value, the phase comparison result detecting part 3 outputs an DEC request signal. Namely, based on the phase comparison signal PC, the phase comparison result detecting part 3 supplies an INC request signal or a DEC request signal to the clock generating part 2 and the execution rate computing part 4.

The clock generating part 2 receives the master clock signal MCLK, the INC/DEC request signal from the phase comparison result detecting part 3, execution rate data from the execution rate computing part 4, and the ON/OFF signal for controlling execution of phase absorption operation in accordance with the received execution rate data. Then, the clock generating part 2 outputs the output clock signal BCLK generated by counting and dividing the master clock signal MCLK.

Here, when the clock generating part 2 receives the INC request signal, the clock generating part 2 shifts the phase of the output clock signal BCLK by one pulse by counting the counter value for counting and dividing the master clock signal MCLK plus one pulse so that the phase of the output clock signal BCLK can approach that of the input clock signal ACLK. On the other hand, when the clock generating part 2 receives the DEC request signal, the clock generating part 2 shifts the phase of the output clock signal BCLK by one pulse by counting the counter value minus one pulse so that the phase of the output clock signal BCLK can approach that of the input clock signal ACLK. In order to control the phase absorption characteristic, the INC/DEC request signal is masked in accordance with the execution rate.

The execution rate computing part 4 measures the phase difference between the input clock signal ACLK and the output clock signal BCLK and then determines an execution rate corresponding to the measured phase difference based on execution rate setting data that are prepared to the execution rate computing part 4 in advance. The execution rate computing part 4 supplies the determined execution rate to the clock generating part 2. The phase difference is obtained by counting the INC/DEC request signal every predetermined time interval. Here, if the counter value per the predetermined time interval is large, it is considered that the phase difference between the output clock signal BCLK and the input clock signal ACLK is large. Here, since the counter value is proportional to the phase difference, it is reasonable to use the execution rate proportional to the counter value.

Based on the computed execution rate, the clock generating part 2 masks the INC/DEC request signal. For instance, if the execution rate is 1/1, the clock generating part 2 counts up/down the counter values in accordance with the INC/DEC request signal without masking the INC/DEC request signal so as to control the phase of the output clock signal BCLK. If the operation rate is 1/2, the clock generating part 2 masks the INC/DEC request signal every two times. If the operation rate is 3/4, the clock generating part 2 masks the INC/DEC request signal every four times and counts up/down the counter value in accordance with the INC/DEC request signal the other three times. Also, if the ON/OFF signal is ON, the clock generating part 2 executes the phase absorption process corresponding to the execution rate. On the other hand, if the ON/OFF signal is OFF, the clock generating part 2 masks all the INC/DEC request signals and halts the phase absorption process.

As a result, when the phase difference between the output clock signal BCLK and the input clock signal ACLK is large, it is possible to synchronize the output clock signal BCLK with the input clock signal ACLK at high speed. At the same time, when the phase difference between the output clock signal BCLK and the input clock signal ACLK is small, it is possible to not only suppress jitter but also obtain satisfactory phase absorption characteristics corresponding to the execution rate. Furthermore, it is possible to reduce wander in the DPLL circuit.

Figure 3:
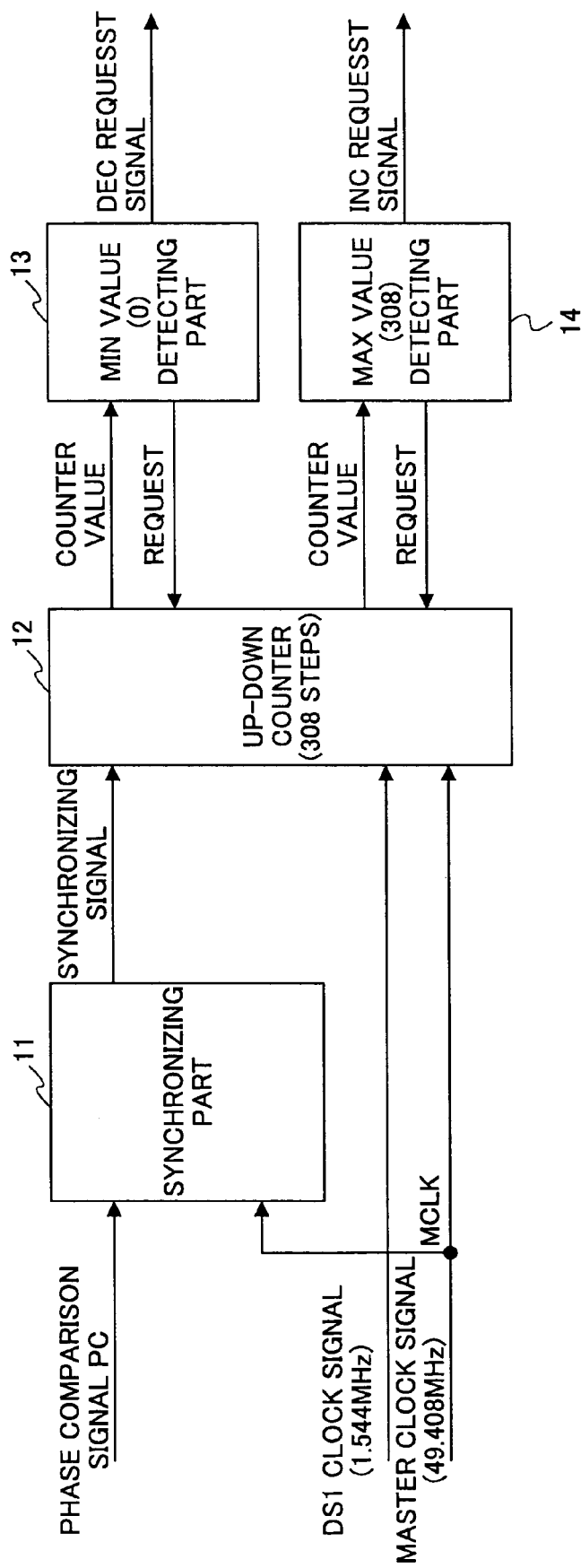
FIG. 3 is a block diagram illustrating the structure of a phase comparison result detecting part according to the embodiment.

FIG. 3 shows the structure of the phase comparison result detecting part 3. As is shown in FIG. 3, the phase comparison result detecting part 3 comprises a synchronizing part 11, an up-down counter 12 formed of 308 steps, a MIN value (0) detecting part 13 and a MAX value (308) detecting part 14. The synthesizing part 11 synthesizes the phase comparison signal PC with the master clock signal being at 49.408 MHz and then supplies the resulting signal as a synchronization signal to the up-down counter 12. The up-down counter 12 receives a DS1 clock signal being at 1.544 MHz and the master clock signal being at 49.408 MHz together with the synchronization signal. The DS1 clock signal corresponds to a DS-1 signal being at 1.544 MHz in the PCM (Pulse Code Modulation) system or a clock signal of container data C-11 being at 1.544 Mbps.

The up-down counter 12 initially sets the counter value thereof as the center value 154 of the 308 steps. When the phase comparison result signal PC synchronous with the master clock signal MCLK is HIGH/LOW, the up-down counter 12 counts up/down the DS1 clock signal. When the MIN value (0) detecting part 13 detects that the counter value reaches the minimum value 0, the MIN value (0) detecting part 13 outputs the DEC request signal and then returns the counter value of the up-down counter 12 to the center value 154. On the other hand, the MAX value (308) detecting part 14 detects that the counter value reaches the maximum value 308, the MAX value (308) detecting part 14 outputs the INC request signal and then returns the counter value of the up-down counter 12 to the center value 154. The MIN value (0) detecting part 13 and the MAX value (308) detecting part 14 correspond to a detecting part for detecting that the counter value reaches the predetermined minimum and maximum values and then outputting the DEC request signal and the INC request signal, respectively.

FIGS. 4A through 4C are signal timing charts related to the phase comparison signal PC in the case where the phase comparing part 1 is formed as an exclusive OR circuit. FIG. 4A illustrates a normal phase condition, FIG. 4B shows a phase condition where the output clock signal BCLK goes ahead the input clock signal ACLK, and FIG. 4C shows a phase condition where the output clock signal BCLK goes behind the input clock signal ACLK. In FIGS. 4A through 4C, the output clock signal BCLK is considered as a reference signal, and the arrow in FIG. 4B indicates that the input clock signal ACLK goes behind the output clock signal BCLK, and the arrow in FIG. 4C indicates that the input clock signal ACLK goes ahead the output clock signal BCLK.

In the normal condition as shown in FIG. 4A, the phases of the input clock signal and the output clock signal are synchronous with each other, and subsequently the phase comparison signal PC has the same interval width of the HIGH level and the LOW level. As a result, the number of count-ups is equal to the number of count-downs in the up-down counter 12.

If the normal condition in FIG. 4A shifts to the phase condition in FIG. 4B, that is, if the input clock signal ACLK is delayed, the phase comparison signal PC has a shorter interval in the HIGH level. As a result, the number of count-downs increases in the up-down counter 12. Namely, the up-down counter value decreases. Then, when the up-down counter value reaches the minimum value 0, the MIN value (0) detecting part 13 detects that the counter value becomes 0 and then outputs the DEC request signal.

On the other hand, if the normal condition in FIG. 4A shifts to the phase condition in FIG. 4C, that is, if the input clock signal ACLK goes ahead, the phase comparison signal PC has a longer interval in the HIGH level. As a result, the number of counter-ups increases in the up-down counter 12. Namely, the up-down counter value increases. Then, when the up-down counter value reaches the maximum value 308, the MAX value (308) detecting part 14 detects that the counter value becomes 308 and then outputs the INC request signal.

Figure 5A:
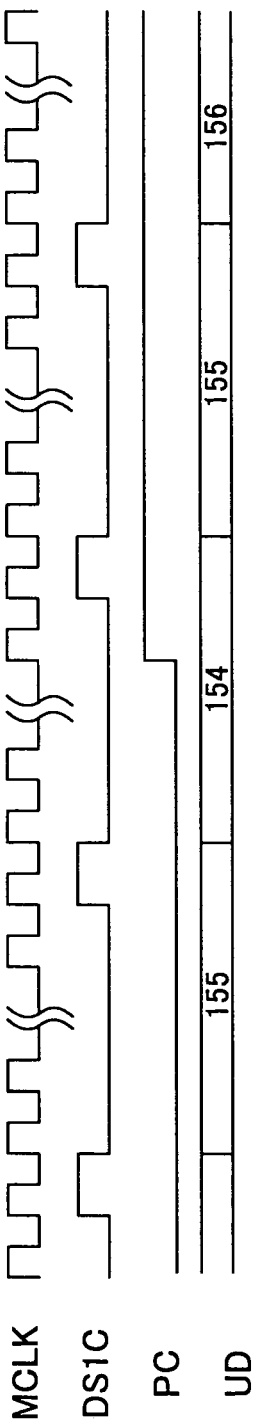
FIGS. 5A through 5C are signal timing charts related to a phase comparison result detecting part.
Figure 5B:
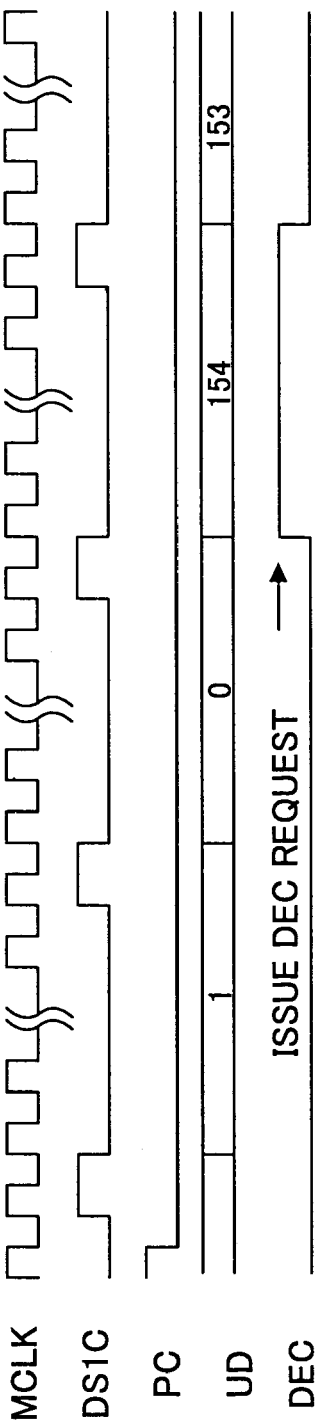
Figure 5C:
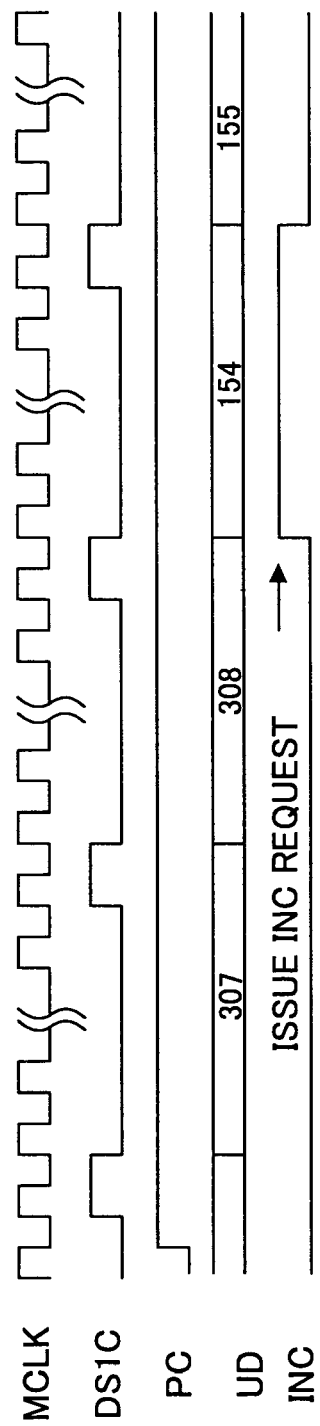

FIGS. 5A through 5C are signal timing charts related to the phase comparison result detecting part 3. FIGS. 5A, 5B and 5C correspond to the phase conditions in FIGS. 4A, 4B and 4C, respectively. In FIGS. 5A through 5C, MCLK, DS1C, PC, UD, DEC and INC represent the master clock signal, the DS1 clock signal, the phase comparison signal, the up-down counter value, the DEC request signal and the INC request signal, respectively.

While the phase comparison signal PC synchronous with the master clock signal MCLK is HIGH, the DS1 clock signal DS1C counts up the up-down counter value UD. In contrast, while the phase comparison signal PC synchronous with the master clock signal MCLK is LOW, the DS1 clock signal DS1C counts down the up-down counter value UD. In the normal condition in FIG. 5A, the up-down counter value UD is still around the center value 154 because the number of count-ups is equal to the number of count-downs.

In the phase condition in FIG. 5B, since the phase comparison signal PC has a longer period in the LOW level than the HIGH level, there are more opportunities of counting down the up-down counter value UD. Eventually, when the up-down counter value UD reaches 0, the MIN value (0) detecting part 13 outputs the DEC request signal. After that, the up-down counter value UD returns to the center value 154.

In the phase condition in FIG. 5C, since the phase comparison signal PC has a longer period in the HIGH level than the LOW level, there are more opportunities of counting up the up-down counter value UD. Eventually, when the up-down counter value UD reaches 308, the MAX value (308) detecting part 14 outputs the INC request signal. After that, the up-down counter value UD returns to the center value 154.

Figure 6:
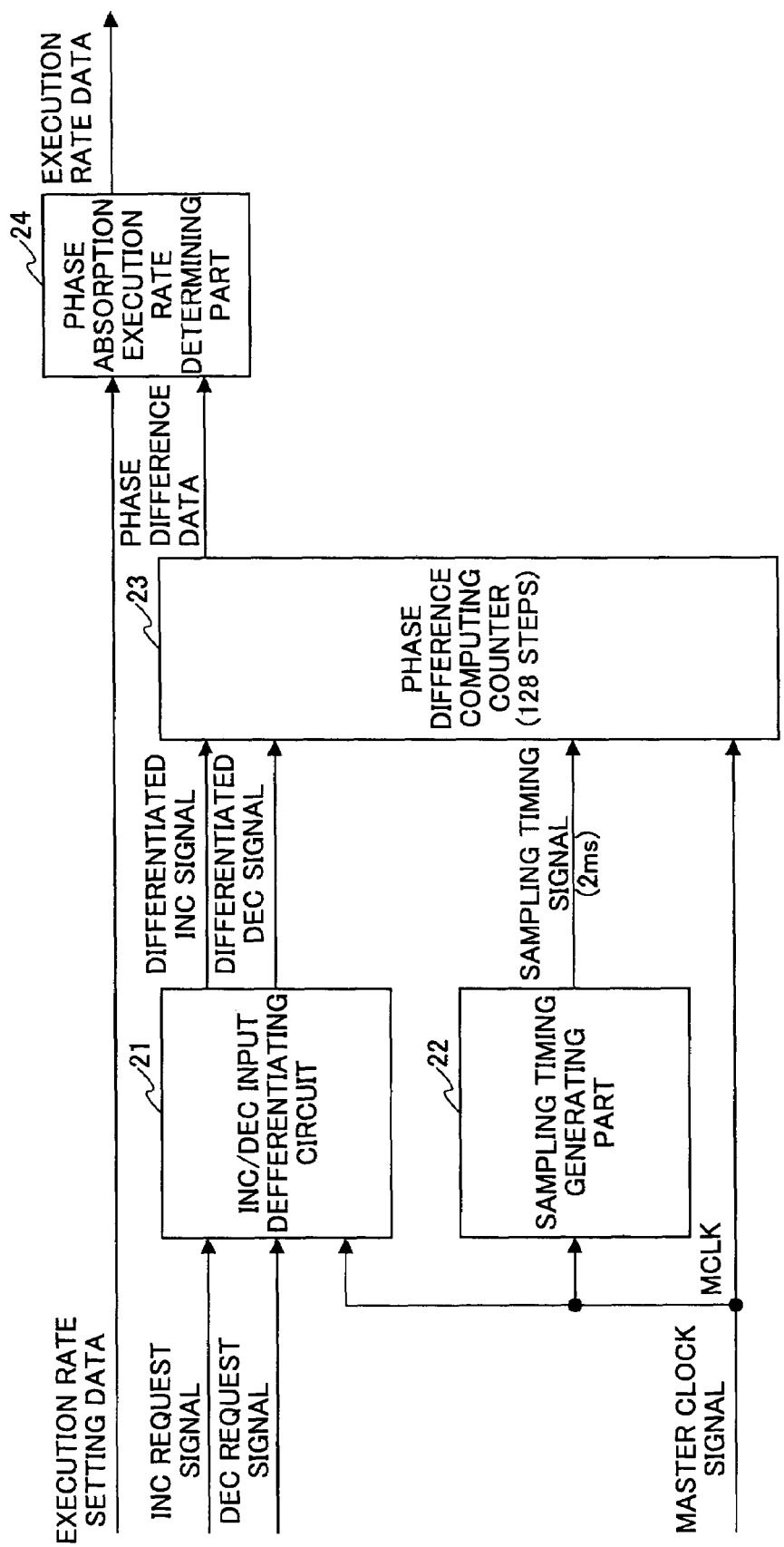
FIG. 6 is a block diagram illustrating the structure of an execution rate computing part according to the embodiment.

FIG. 6 shows the structure of the execution rate computing part 4. As is shown in FIG. 6, the execution rate computing part 4 comprises an INC/DEC input differentiating circuit 21, a sampling timing generating part 22, a phase difference computing counter 23 formed of 128 steps, and a phase absorption execution rate determining part 24. The master clock signal MCLK being at 49.408 MHz is supplied to the INC/DEC input differentiating circuit 21, the sampling timing generating part 22 and the phase difference computing counter 23. Then, the sampling timing generating part 22 generates a sampling timing signal having a 2 ms period and supplies the sampling timing signal to the phase difference computing counter 23.

The INC/DEC input differentiating circuit 21 differentiates the INC request signal and the DEC request signal by the master clock signal MCLK and supplies the differentiated INC signal and the differentiated DEC signal to the phase difference computing counter 23. The phase difference computing counter 23 counts up a phase difference counter value thereof by +1 for the INC differentiated signal and counts down the phase difference counter value by −1 for the DEC differentiated signal. This phase difference counter value is latched by the sampling timing signal and is added to the previous three phase difference counter values so as to compute the current phase difference. Namely, the phase difference is obtained by summing up the most recent four phase difference counter values.

In this case, since the phase difference is updated every 2 ms, the phase difference counter values in 8 ms period influences the phase difference. If the phase difference is computed based on a phase difference counter value formed of only one 8 ms period rather than the above phase difference formed of four 2 ms periods, the execution rate would have the longer update interval, that is, the execution rate would be less frequently updated. In the execution rate according to the embodiment, however, since the phase difference counter value is updated for every 2 ms period in the execution rate computing part 4, the execution rate is more frequently updated than in the phase difference counter value formed of only one 8 ms period. Thus, it is possible to more smoothly update the execution rate at the 2 ms period than at the 8 ms period. As a result, the DPLL circuit according to the embodiment can achieve the stable phase absorption characteristic.

With reference to correspondence between phase differences and execution rates in the execution rate setting data, the phase absorption execution rate determining part 24 determines the execution rate corresponding to the computed phase difference and supplies the determined execution rate to the clock generating part 3. Here, if the phase difference is large, the phase absorption execution rate determining part 24 assigns a large value to the execution rate so that the phase synchronization can be attained at high speed. If the phase difference is small, the phase absorption execution rate determining part 24 assigns a small value to the execution rate so that the phase synchronization can be processed at low speed in order to suppress jitter. While the phase difference decreases from a large phase difference to a small phase difference, the phase absorption execution rate determining part 24 assigns a value that can achieve a desired level of the phase absorption characteristic to the execution rate.

FIG. 7 shows an execution rate setting data table in which phase differences of various bit values correspond to the operation rates 1/1, 3/4, 1/2 and 1/4. With reference to the execution rate setting data table, the phase absorption execution rate determining part 24 can determine the execution rate in accordance with the bit-unit phase difference from the phase difference computing counter 23. Here, if the DPLL circuit according to the embodiment has a processor for performing some operations, it is also possible to obtain the execution rate corresponding to the phase difference from the phase difference computing counter 23 by executing a predetermined execution rate computing program that has been prepared in advance.

As is shown in the execution rate setting data table in FIG. 7, if the phase difference is in 36 bits through 50 bits, the execution rate is set as 1/1. In the execution rate 1/1, the clock generating part 2 follows the INC/DEC request signal. If the phase difference is in 1 bit through 5 bits, the execution rate is set as 1/2. In the execution rate 1/2, the clock generating part 2 follows the INC/DEC request signal every two times. If the phase difference is in 27 bits through 35 bits, the execution rate is set as 3/4. In the execution rate 3/4, the clock generating part 2 follows the INC/DEC request signal three times out of four. If the phase difference is 6 bits, the execution rate is set as 1/4. In the execution rate 1/4, the clock generating part 2 follows the INC/DEC request signal every fourth time.

FIGS. 8A through 8D are diagrams for explaining mask operations for the INC/DEC request signal in accordance with the execution rates. If the execution rate is 1/1, the clock generating part 2 performs the phase synchronization without masking the INC/DEC request. If the execution rate is 1/2, the clock generating part 2 masks the INC/DEC request as illustrated by the dotted lines in FIG. 8B every second time and performs the phase synchronization the other one time. If the execution rate is 1/4, the clock generating part 2 masks the INC/DEC request as illustrated by the dotted lines in FIG. 8C three times out of four and performs the phase synchronization the other one time. If the execution rate is 1/4, the clock generating part 2 masks the INC/DEC request as illustrated by the dotted lines in FIG. 8D every fourth time and performs the phase synchronization the other three times.

Figure 9:
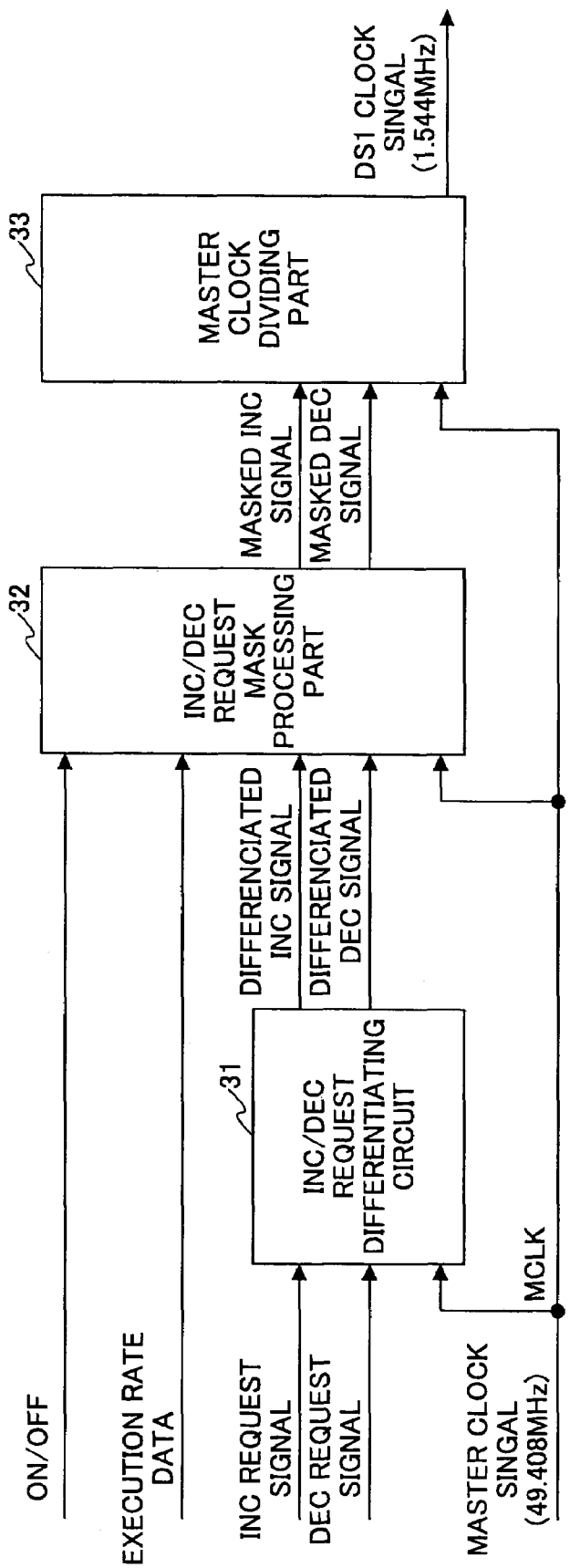
FIG. 9 is a diagram illustrating the structure of a clock generating part according to the embodiment.

FIG. 9 shows the structure of the clock generating part 2. As is shown in FIG. 9, the clock generating part 2 comprises an INC/DEC differentiating circuit 31, an INC/DEC request mask processing part 32, and a master clock dividing part 33. The INC/DEC request differentiating circuit 31 receives the INC/DEC request signal from the phase comparison result detecting part 3. Synchronously with the master clock signal MCLK being at 49.408 MHz, the INC differentiated signal and the DEC differentiated signal are generated by differentiating the INC request signal and the DEC request signal, respectively, by the pulse width of the master clock signal MCLK. After that, the INC/DEC request differentiating circuit 31 supplies the INC differentiated signal or the DEC differentiated signal to the INC/DEC request mask processing part 32.

The INC/DEC request mask processing part 32 and the above-mentioned phase absorption execution rate determining part 24 function as a control part for controlling a signal for prescribing a division number for dividing the master clock signal MCLK and adjusting the phase absorption speed in accordance with the phase difference between the input clock signal ACLK and the output clock signal BCLK. Also, the INC/DEC request mask processing part 32 receives the ON/OFF signal for switching ON/OFF execution of the phase absorption process in accordance with the execution rate, the INC differentiated signal, the DEC differentiated signal and the master clock signal MCLK. When the phase absorption process is performed, the INC/DEC request mask processing part 32 masks the INC differentiated signal or the DEC differentiated signal in accordance with the execution rate. The INC/DEC request mask processing part 32 supplies the masked INC signal or the masked DEC signal to the master clock dividing part 33. The master clock dividing part 33 inserts or deletes one pulse of the master clock signal MCLK and then outputs the DS1 clock signal being at 1.544 MHz.

FIGS. 10A through 10C are signal timing charts related to the clock generating part 2. In FIGS. 10A through 10C, MCLK, DC, DS1C, INC and DEC represent the master clock signal, the counter value of the master clock dividing part 33 for 1/32 -dividing the master clock signal MCLK, the DS1 clock signal, the INC request signal and the DEC request signal. In FIG. 10A, the master clock dividing part 33 1/32-divides the master clock signal MCLK in order to generate the DS1 clock DS1C.

Here, if the DEC request signal is supplied as shown in FIG. 10B, the counter value DC is set to delete one pulse from the master clock MCLK as shown in (a) in FIG. 10B. This deletion corresponds to 1/31-division operation for the master clock signal MCLK. As a result, the phase of the DS1 clock signal DS1C is delayed. On the other hand, if the INC request signal is supplied, the counter value DC is set to count the master clock signal plus one pulse as shown in (b) in FIG. 10C. This insertion corresponds to 1/33-division operation for the master clock signal MCLK. As a result, the phase of the DS1 clock signal DS1C goes ahead.

In this fashion, the clock generating part 2 outputs the DS1 clock signal DS1C being at 1.544 MHz as the output clock signal BCLK by dividing the master clock signal MCLK being at 49.408 MHz under some variable division rates. If the phase difference between the output clock signal BCLK and the input clock signal ACLK is large, it is possible to increase the speed of the phase absorption characteristic by setting the execution rate as, for instance, 1/1. If the phase difference between the output clock signal BCLK and the input clock signal ACLK is small, it is possible to decrease the speed of the phase absorption characteristic by setting the execution rate as, for instance, 1/2. If the phase difference is moderate, the execution rate is set to obtain a desired phase absorption characteristic. As a result, it is possible to not only achieve high speed phase synchronization but also suppress jitter and wander.

Figure 11A:
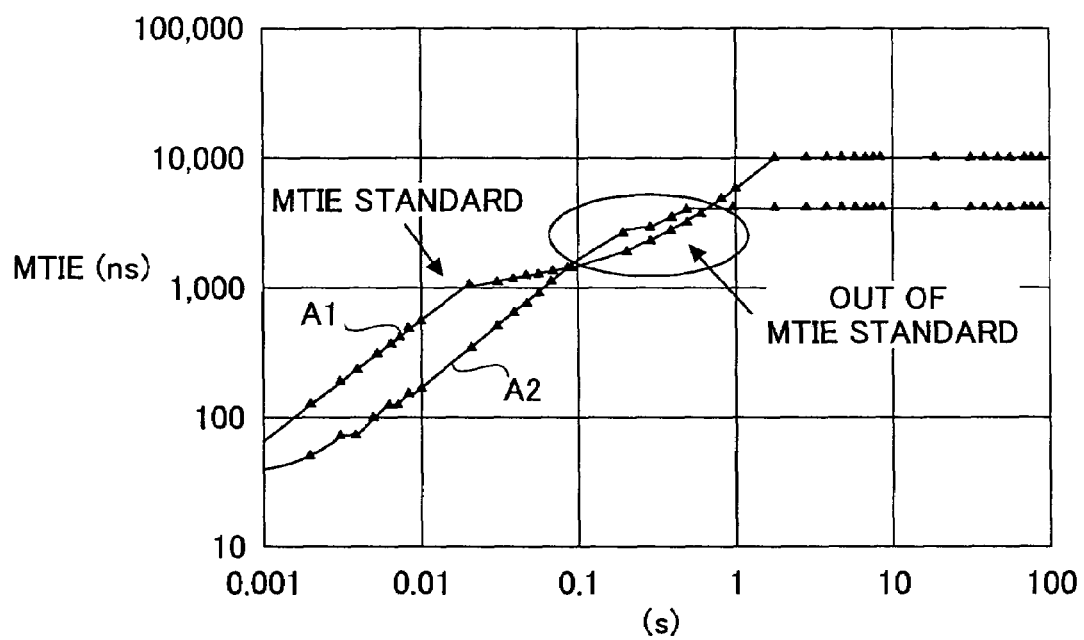
FIGS. 11A and 11B are graphs for explaining the MTIE characteristic.
Figure 11B:
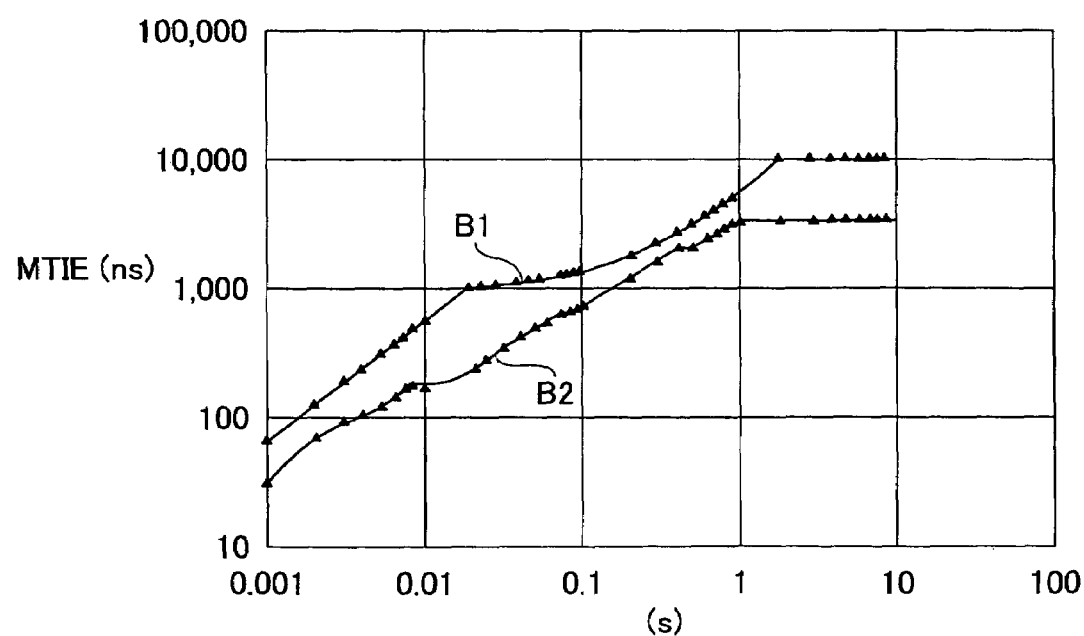

FIGS. 11A and 11B are graphs related to the MTIE characteristic wherein the horizontal axis and the vertical axis represent measuring time and MTIE (ns), respectively. In addition, the curves A1 and B1 are characteristic curves that comply with the MTIE standard for the demapping process from SDH frame to C-N data, the curve A2 is an MTIE characteristic curve that is measured under a conventional DPLL circuit, and the curve B2 is an MTIE characteristic curve that is measured under the DPLL according to the embodiment.

In the conventional DPLL circuit, the execution rate is not set. Thus, the conventional DPLL circuit has a range out of the MTIE standard as shown in FIG. 11A. In contrast, the DPLL circuit according to the embodiment can adjust the phase absorption characteristic in accordance with the phase difference by setting the execution rate corresponding to the phase difference. As a result, the DPLL circuit according to the embodiment can satisfy the MTIE standard in all ranges as shown in the curve B2. Here, even if the MTIE standard is changed in the future, the DPLL circuit can satisfy a new MTIE standard by preparing execution rate data corresponding to the new MTIE.

Figure 1:
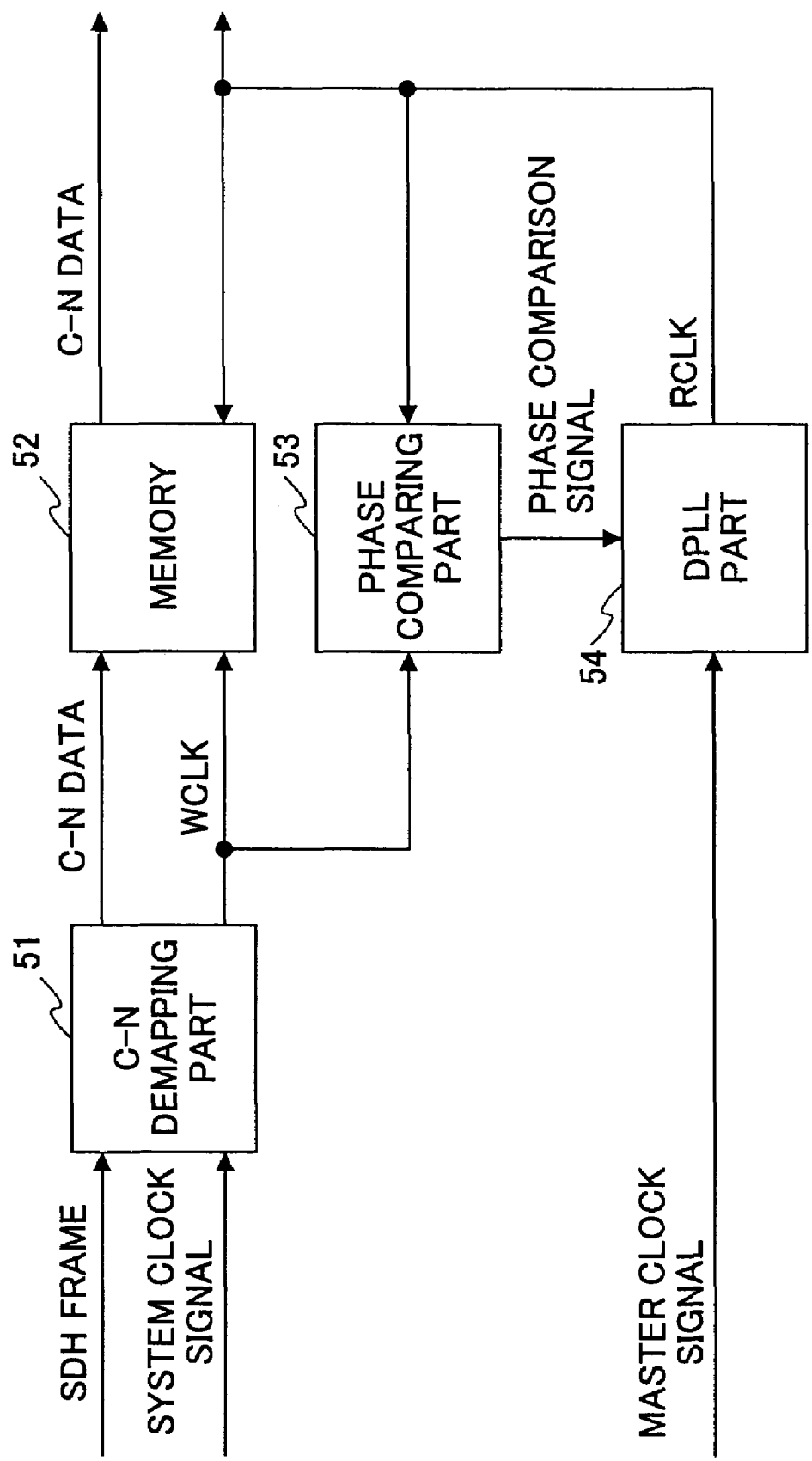
FIG. 1 is a diagram for explaining a conventional DPLL circuit for processing demapped C-N data.

The present invention is not limited to the above-mentioned embodiment. The DPLL circuit according to the present invention is applicable to the conventional DPLL circuit as shown in FIG. 1, that is, the DPLL circuit for writing the demapped C-N data in the memory in accordance with the write clock signal and then reading the demapped C-N data from the memory in accordance with the read clock signal synchronous with the write clock signal. Furthermore, the DPLL circuit according to the present invention is applicable to various DPLL circuits for locking the phase of a clock signal that is supplied in a burst fashion and obtaining a continuous clock signal.

The present invention is not limited to the specifically disclosed embodiments, and variations and modifications may be without departing from the scope of the present invention.

What is claimed is:

1. A digital phase locked circuit for synchronizing a phase of an output clock signal with a phase of an input clock signal wherein said output clock signal is generated by dividing a master clock signal, comprising:
    a phase comparing part comparing the phase of said output clock signal with the phase of said input clock signal;
    a phase comparison result detecting part referring to a comparison result from said phase comparing part and outputting a signal increasing/decreasing a division number for dividing said master clock signal when the phase of said output clock signal proceeds forward/recedes behind the phase of said input clock signal;
    a mask processing part identifying a single applied mask rate among a plurality of mask rates for masking a part of an increasing/decreasing (INC/DEC) request signal depending on a phase difference between the input clock signal and the master clock signal, wherein as the phase difference increases, the mask rate is made lower, and as the phase difference decreases, the mask rate is made higher, masking the output signal from the phase comparison result detecting part depending on the identified mask rate, and outputting the masked signal; and
    a dividing part obtaining the divided clock signal by controlling increasing or decreasing operation on the division number based on the outputted masked signal.

2. The digital phase locked circuit as claimed in claim 1, wherein said phase comparison result detecting part, comprises:
    an up-down counter counting up/down when a phase comparison signal, comprising an exclusive OR signal of said input clock signal and said output clock signal from said phase comparing part, is HIGH/LOW, respectively; and
    a detecting part outputting a decreasing (DEC) request signal when a minimum counter value of said up/down counter is detected and an increasing (INC) request signal when a maximum counter value of said up/down counter is detected.

3. The digital phase locked circuit as claimed in claim 1, wherein an execution rate computing part has a phase difference computing counter counting up/down a phase difference counter value thereof based on said INC/DEC request signal, respectively from said phase comparison result detecting part and setting said phase difference counter value as a computed phase difference and a phase absorption execution rate determining part outputting an execution rate corresponding to said computed phase difference with reference to a correspondence table in which correspondence between phase differences and execution rates is stored.

4. The digital phase locked circuit as claimed in claim 3, wherein said execution rate computing part sets said computed phase difference by summing up a plurality of counter values for each predetermined time interval, the counter values computed by sampling said phase difference counter in a shorter time interval.

5. A method for synchronizing a phase of an output clock signal with a phase of an input clock signal wherein said output clock signal is generated by dividing a master clock signal, comprising:
    comparing the phase of said output clock signal with the phase of said input clock signal and outputting a comparison result;

detecting the comparison result from said phase comparing and outputting a signal increasing/decreasing a division number for dividing said master clock signal when the phase of said output clock signal proceeds forward/recedes behind the phase of said input clock signal;

identifying a single applied mask rate among a plurality of mask rates for masking a part of an increasing/decreasing (INC/DEC) request signal depending on a phase difference between the input clock signal and the master clock signal, wherein as the phase difference increases, the mask rate is made lower, and as the phase difference decreases, the mask rate is made higher, masking the output signal from the phase comparison result detecting depending on the identified mask rate, and outputting the masked signal; and obtaining a divided clock signal by controlling an increasing or decreasing operation on the division number based on the outputted masked signal.

* * * * *